(12) United States Patent
Bang et al.

(10) Patent No.: US 12,317,710 B2
(45) Date of Patent: May 27, 2025

(54) METHOD OF DETERMINING THE SPREAD OF AN ORGANIC LAYER IN AN OLED

(71) Applicant: Samsung Display Co., Ltd., Yongin-si (KR)

(72) Inventors: Ki Ho Bang, Hwaseong-si (KR); Eun Hye Kim, Namyangju-si (KR); Won Suk Choi, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 18/545,278

(22) Filed: Dec. 19, 2023

(65) Prior Publication Data

US 2024/0122017 A1    Apr. 11, 2024

Related U.S. Application Data

(62) Division of application No. 17/114,986, filed on Dec. 8, 2020, now Pat. No. 11,882,735.

(30) Foreign Application Priority Data

Jan. 30, 2020    (KR) .................. 10-2020-0011221

(51) Int. Cl.
*H01L 27/32*    (2006.01)
*H01L 51/52*    (2006.01)
(Continued)

(52) U.S. Cl.
CPC ......... *H10K 59/131* (2023.02); *H10K 50/844* (2023.02); *H10K 59/122* (2023.02); *H10K 71/00* (2023.02); *H10K 59/1201* (2023.02)

(58) Field of Classification Search
CPC .................................................... H10K 59/131
See application file for complete search history.

(56) References Cited

U.S. PATENT DOCUMENTS 11,004,927 B2    5/2021    Cho et al.
11,489,025 B2    11/2022    Kim et al.
(Continued)

FOREIGN PATENT DOCUMENTS

CN    108091675 A    5/2018
KR    20170003803 A  *  1/2017
(Continued)

OTHER PUBLICATIONS

Extended European Search Report for Application No. 20213987.9 dated May 31, 2021.

*Primary Examiner* — Peter Bradford
(74) *Attorney, Agent, or Firm* — CANTOR COLBURN LLP

(57) ABSTRACT

A display apparatus includes a base substrate on which a display area and a non-display area are defined, a first via insulating layer on the base substrate, a first power supply wire in the non-display area on the first via insulating layer, a second power supply wire in the non-display area on the first via insulating layer spaced apart from the first power supply wire, a first dam on the base substrate, overlapping the first and second power supply wires, and extending along the non-display area, a first stacked structure on the first via insulating layer between the first dam and the display area, and having a height less than a height of the first dam, and an organic layer on the first stacked structure and the first dam to overlap a substantially entire portion of the first stacked structure and at least a portion of the first dam.

5 Claims, 17 Drawing Sheets

(51) Int. Cl.
*H01L 51/56* (2006.01)
*H10K 50/844* (2023.01)
*H10K 59/122* (2023.01)
*H10K 59/131* (2023.01)
*H10K 71/00* (2023.01)
*H10K 59/12* (2023.01)

(56) References Cited

U.S. PATENT DOCUMENTS

| | | |
|---|---|---|
| 2003/0164674 A1 | 9/2003 | Imamura |
| 2010/0157412 A1* | 6/2010 | Lee ............... G02F 1/1679 |
| | | 445/25 |
| 2015/0380685 A1 | 12/2015 | Lee et al. |
| 2016/0285038 A1* | 9/2016 | Kim ............... H10K 50/84 |
| 2017/0244063 A1 | 8/2017 | Furuie |
| 2017/0345847 A1 | 11/2017 | Kim et al. |
| 2017/0345881 A1 | 11/2017 | Kim et al. |
| 2018/0033998 A1 | 2/2018 | Kim et al. |
| 2019/0006442 A1 | 1/2019 | Byun et al. |
| 2019/0288234 A1* | 9/2019 | Kim ............... H10K 59/8722 |
| 2019/0296099 A1 | 9/2019 | Lee et al. |
| 2020/0006461 A1* | 1/2020 | Cho ............... H10K 59/1213 |
| 2020/0243401 A1* | 7/2020 | Wang ............... H10K 71/70 |
| 2021/0359252 A1* | 11/2021 | Wang ............... H10K 50/844 |
| 2022/0231257 A1* | 7/2022 | Wang ............... H10K 59/878 |

FOREIGN PATENT DOCUMENTS

| | | | |
|---|---|---|---|
| KR | 20180014398 A | | 2/2018 |
| KR | 20200003332 A | | 1/2020 |
| KR | 20210063508 A | * | 6/2021 |

* cited by examiner

METHOD OF DETERMINING THE SPREAD OF AN ORGANIC LAYER IN AN OLED

This application is a divisional of U.S. patent application Ser. No. 17/114,986, filed on Dec. 8, 2020, which claims priority to Korean Patent Application No. 10-2020-0011221, filed on Jan. 30, 2020, and all the benefits accruing therefrom under 35 U.S.C. § 119, the content of which in its entirety is herein incorporated by reference.

BACKGROUND

1. Field

The invention relates to a display apparatus and a method of manufacturing the display apparatus, and more particularly, to a display apparatus in which quality of an organic layer of a thin film encapsulation layer is improved, and a method of manufacturing the display apparatus.

2. Description of the Related Art

Recently, as the technology improves, display products having smaller sizes, lighter weights, and superior performance have been produced. Conventional cathode ray tube ("CRT") televisions had been widely used for display apparatuses with desired features in terms of performance and price. Recently, however, a display apparatus such as a plasma display apparatus, a liquid crystal display apparatus, and an organic light-emitting diode display apparatus having desired features such as miniaturization, light weight, and low power consumption has been spotlighted.

SUMMARY

A display apparatus may include an internal structure sealed by a thin film encapsulation layer, and a touch screen panel formed on the thin film encapsulation layer. For example, an organic light-emitting diode display apparatus may have a structure including a thin film encapsulation layer and a touch screen panel directly formed on the thin film encapsulation layer. In this case, quality of the thin film encapsulation layer may affect display quality and quality of the touch screen panel.

Embodiments provide a display apparatus including a thin film encapsulation layer with improved quality.

Embodiments provide a method of manufacturing the display apparatus.

According to an embodiment, a display apparatus includes a base substrate, where a display area for displaying an image and a non-display area adjacent to the display area are defined on the base substrate, a first via insulating layer disposed on the base substrate, a first power supply wire disposed in the non-display area on the first via insulating layer, a second power supply wire disposed in the non-display area on the first via insulating layer spaced apart from the first power supply wire, a first dam disposed on the base substrate, where the first dam overlaps the first power supply wire and the second power supply wire, and extends along the non-display area, a first stacked structure disposed on the first via insulating layer between the first dam and the display area, where the first stacked structure has a height less than a height of the first dam, and an organic layer disposed on the first stacked structure and the first dam to overlap a substantially entire portion of the first stacked structure and at least a portion of the first dam.

In an embodiment, the display apparatus may further include second stacked structure disposed between the first stacked structure and the first dam.

In an embodiment, the display apparatus may further include a second via insulating layer disposed on the first via insulating layer. In such an embodiment, the first stacked structure may include a portion of the second via insulating layer, the first dam may include a portion of the second via insulating layer, and the second via insulating layer may have a first height at the first dam, and a second height less than the first height at the first stacked structure.

In an embodiment, the display apparatus may further include a pixel-defining layer disposed on the second via insulating layer. In such an embodiment, the first stacked structure may include a portion of the pixel-defining layer, and the first dam may include a portion of the pixel-defining layer.

In an embodiment, a height of the first stacked structure may be less than a height of the second stacked structure.

In an embodiment, the first stacked structure may extend parallel to the first dam in a first direction.

In an embodiment, the first stacked structure may be connected to the first dam such that the first stacked structure and the first dam form a step.

In an embodiment, the first stacked structure may be spaced apart from the first power supply wire and the second power supply wire.

In an embodiment, a plurality of holes may be defined through the first power supply wire and the second power supply wire, and the holes may be located between the first stacked structure and the first dam.

In an embodiment, the display apparatus may further include a first electrode disposed in the display area on the base substrate, a light-emitting layer disposed on the first electrode, and a second electrode disposed on the light-emitting layer. In such an embodiment, the second electrode may be disposed on the first stacked structure and the first dam to overlap a substantially entire portion of the first stacked structure and at least a portion of the first dam.

According to an embodiment, a display apparatus includes a base substrate, a first conductive layer disposed on the base substrate, where the first conductive layer includes a source electrode and a drain electrode of a thin film transistor, a first via insulating layer disposed on the first conductive layer, a second conductive layer disposed on the first via insulating layer, a second via insulating layer disposed on the second conductive layer, a pixel-defining layer disposed on the second via insulating layer, a first inorganic layer disposed on the pixel-defining layer, and an organic layer disposed on the first inorganic layer. In such an embodiment, a portion of the second via insulating layer and a portion of the pixel-defining layer constitute a first dam, and a portion of the second via insulating layer and a portion of the pixel-defining layer constitute a first stacked structure having a height less than a height of the first dam. In such an embodiment, the organic layer overlaps a substantially entire portion of the first stacked structure and at least a portion of the first dam.

In an embodiment, the second via insulating layer may have a first height at the first dam, and a second height less than the first height at the first stacked structure.

In an embodiment, the first conductive layer may include a first layer of a first power supply wire, and a first layer of a second power supply wire, which is spaced apart from the first layer of the first power supply wire. In such an embodiment, the second conductive layer may include a second layer of the first power supply wire, and a second layer of the second power supply wire, which is spaced apart from the second layer of the first power supply wire. In such an embodiment, the first layer of the first power supply wire and the second layer of the first power supply wire may be electrically connected to each other, and the first layer of the second power supply wire and the second layer of the second power supply wire may be electrically connected to each other.

In an embodiment, a plurality of holes may be defined through the second layer of the first power supply wire and the second layer of the second power supply wire. In such an embodiment, the holes may be spaced apart from the first stacked structure, or partially overlap the first stacked structure.

In an embodiment, the display apparatus may further include a spacer layer disposed on the pixel-defining layer. In such an embodiment, a portion of the second via insulating layer, a portion of the pixel-defining layer, and a portion of the spacer layer may constitute a second dam which is spaced apart from the first dam, and the first dam may be located between the second dam and the first stacked structure.

According to an embodiment, a method of manufacturing a display apparatus includes: providing a thin film transistor layer, which includes a thin film transistor and an insulating layer, on a base substrate; providing a first via insulating layer on the thin film transistor layer; providing a conductive layer, which includes a power supply wire, on the first via insulating layer; providing a second via insulating layer on the first via insulating layer, on which the conductive layer is provided; providing a first inorganic layer on the base substrate, on which the second via insulating layer is provided; providing an organic material onto the first inorganic layer; and inspecting a spreading degree of the organic material which spreads along a top surface of the first inorganic layer based on a visibility degree of an outer periphery of a first stacked structure. In such an embodiment, a portion of the second via insulating layer constitutes a first dam disposed in the non-display area to surround the display area, and a portion of the second via insulating layer constitutes the first stacked structure disposed between the first dam and the display area in the non-display area.

In an embodiment, a portion of the second via insulating layer may constitute a second stacked structure disposed between the first stacked structure and the display area in the non-display area. In such an embodiment, the inspecting spreading degree of the organic material may include determining that the spreading degree of the organic material reaches a predetermined level when a visibility degree of an outer periphery of the second stacked structure is lowered after the visibility degree of the outer periphery of the first stacked structure is lowered.

In an embodiment, the method may further include providing a pixel-defining layer on the second via insulating layer and the first via insulating layer. In such an embodiment, the first dam may include a portion of the pixel-defining layer, the first stacked structure may include a portion of the pixel-defining layer, and the second stacked structure may include a portion of the pixel-defining layer. In such an embodiment, a height of the first dam may be greater than a height of each of the first stacked structure and the second stacked structure.

In an embodiment, the method may further include: providing a first electrode in the display area on the second via insulating layer, on which the pixel-defining layer is formed; providing a light-emitting layer on the first electrode; and providing a second electrode on the light-emitting layer. In such an embodiment, the second electrode may overlap a substantially entire portion of the first stacked structure and at least a portion of the first dam.

In an embodiment, a plurality of holes may be formed through the power supply wire, and the holes may be located between the first stacked structure and the first dam.

According to embodiments, the display apparatus includes a first stacked structure, and a spreading degree of an organic material for forming a thin film encapsulation layer, which spreads along a top surface of a first inorganic layer, may be inspected based on a visibility degree of an outer periphery of the first stacked structure. Accordingly, a degree of formation of an organic layer including the organic material may be easily detected or inspected, and the thin film encapsulation layer may be provided with improved manufacturing quality.

DETAILED DESCRIPTION

Figure 1:
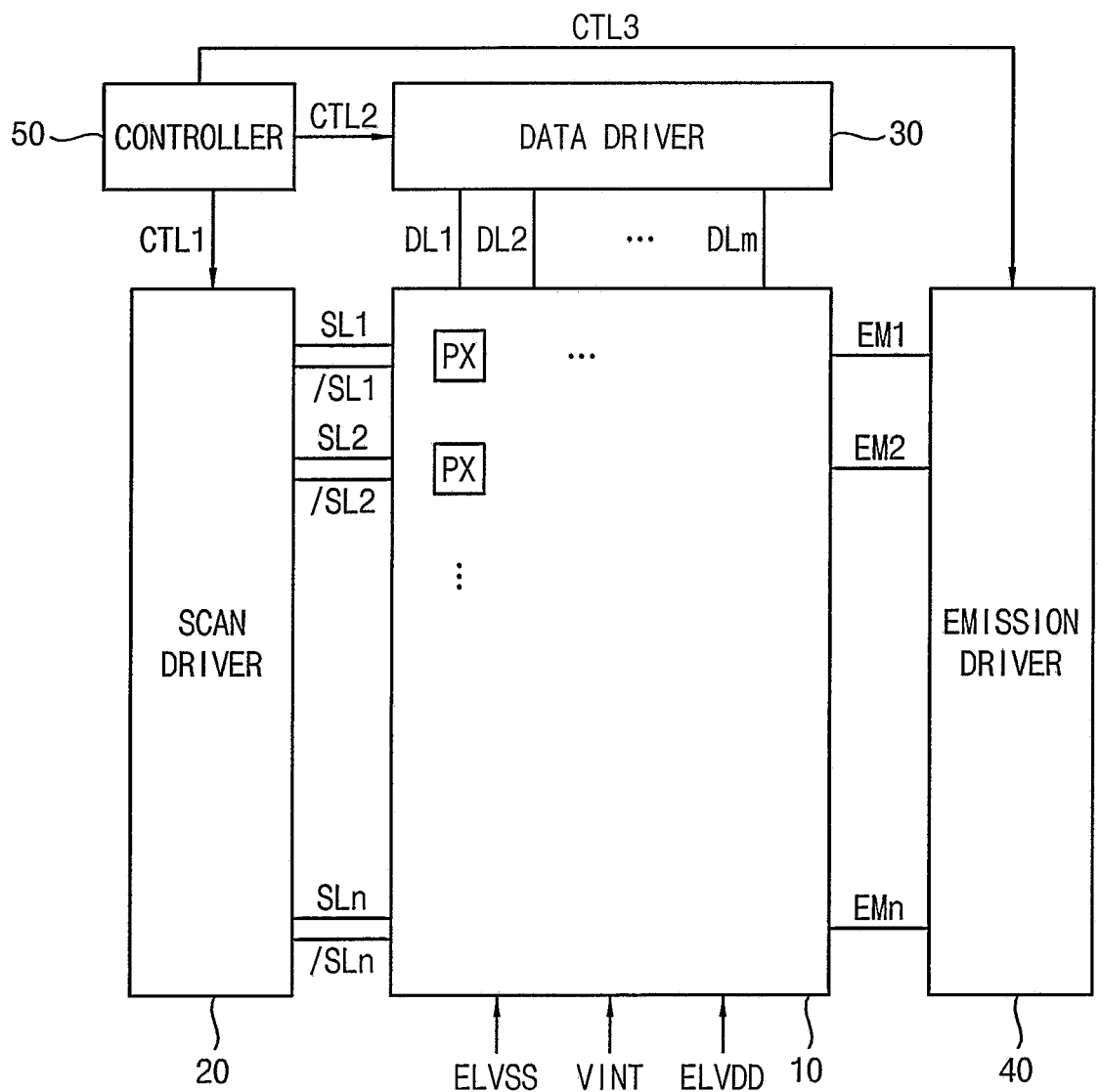
FIG. 1 is a block diagram showing a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a block diagram showing a display apparatus according to an embodiment.

Referring to FIG. 1, an embodiment of a display apparatus may include a display panel 10, a scan driver 20, a data driver 30, an emission control driver 40, and a controller 50.

The display panel 10 may include a plurality of pixels PX for displaying an image. In one embodiment, for example, the display panel 10 may include n×m pixels PX located at intersecting portions of scan lines SL1 to SLn and data lines DL1 to DLm (where each of n and m is an integer greater than 1). A structure of the pixel PX will be described in detail with reference to FIG. 2.

The scan driver 20 may sequentially provide a first scan signal to the pixels PX through the scan lines SL1 to SLn and sequentially provide a second scan signal to the pixels PX through inverted scan lines /SL1 to /SLn based on a first control signal CTL1. In one embodiment, for example, the second scan signal may be an inverted signal of the first scan signal.

The data driver 30 may provide a data signal to the pixels PX through the data lines DL1 to DLm based on a second control signal CTL2.

The emission control driver 40 may sequentially provide an emission control signal to the pixels PX through emission control lines EM1 to EMn based on a third control signal CTL3.

The controller 50 may control the scan driver 20, the data driver 30, and the emission control driver 40. The controller 50 may generate the control signals CTL1 to CTL3 to control the scan driver 20, the data driver 30, and the emission control driver 40. The first control signal CTL1 for controlling the scan driver 20 may include a scan start signal, a scan clock signal, or the like. The second control signal CTL2 for controlling the data driver 30 may include image data, a horizontal start signal, or the like. The third control signal CTL3 for controlling the emission control driver 40 may include an emission control start signal, an emission control clock signal, or the like.

In an embodiment, the display apparatus may further include a power supply unit (not shown) configured to supply a first power supply voltage ELVDD, a second power supply voltage ELVSS, and an initialization voltage VINT to the display panel 10.

Figure 2:
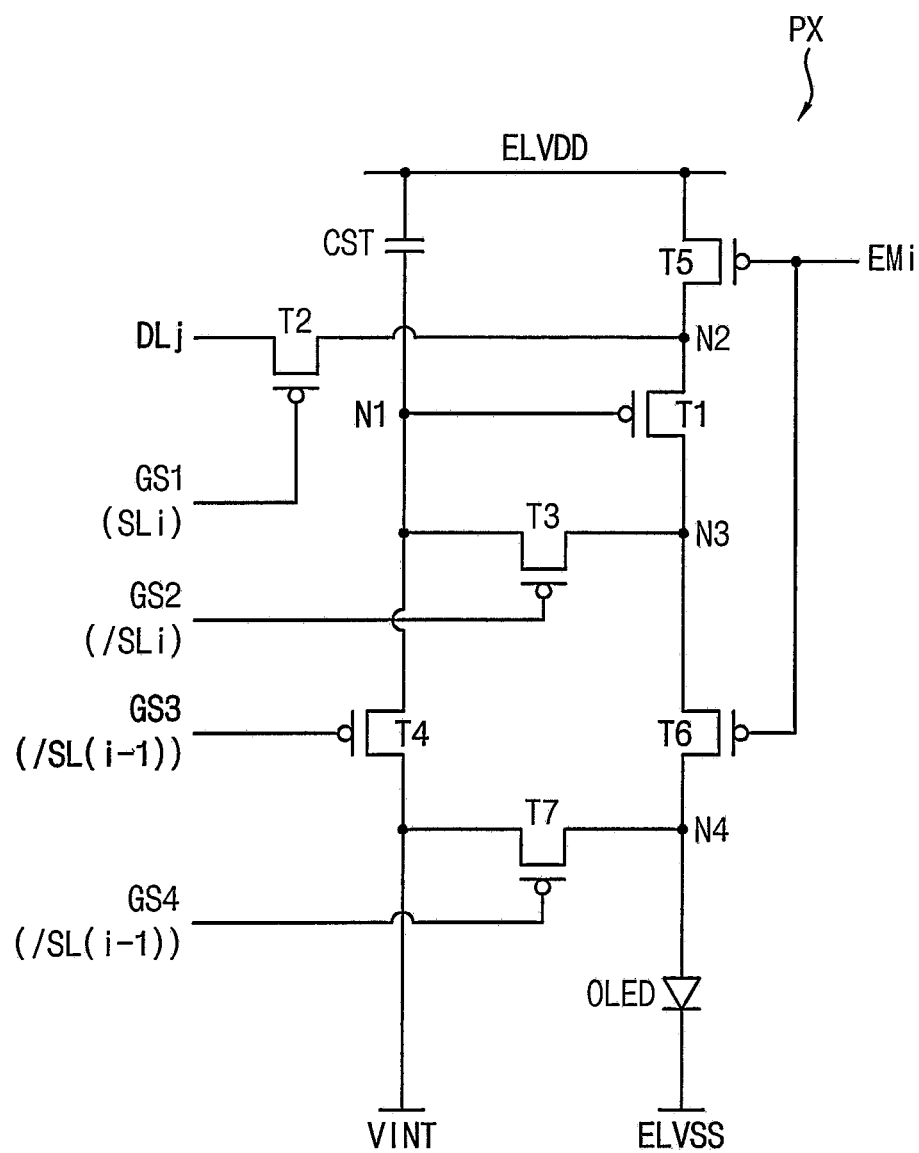
FIG. 2 is an equivalent circuit diagram showing an embodiment of a pixel included in the display apparatus of FIG. 1.

FIG. 2 is an equivalent circuit diagram showing an embodiment of a pixel included in the display apparatus of FIG. 1.

Referring to FIG. 2, an embodiment of the pixel PX may include first to seventh transistors T1 to T7, a storage capacitor CST, and an organic light-emitting diode OLED. The pixel PX may be located in an $i^{th}$ pixel row (where i is an integer between 1 and n) and a $j^{th}$ pixel column (where j is an integer between 1 and m).

The first transistor T1 may be a driving transistor configured to provide a driving current corresponding to the data signal to the organic light-emitting diode OLED. The first transistor T1 may include a gate electrode connected to a first node N1, a first electrode connected to a second node N2, and a second electrode connected to a third node N3.

The second transistor T2 may provide the data signal to the first transistor T1 in response to a first scan signal GS1. In an embodiment, the second transistor T2 may include a gate electrode configured to receive the first scan signal GS1 from an $i^{th}$ scan line SLi, a first electrode configured to receive the data signal from a $j^{th}$ data line DLj, and a second electrode connected to the first electrode of the first transistor T1 (or the second node N2).

The third transistor T3 may connect the second electrode of the first transistor T1 to the gate electrode of the first transistor T1 in response to a second scan signal GS2. In an embodiment, the third transistor T3 may include a gate electrode configured to receive the second scan signal GS2 from an $i^{th}$ inverted scan line /SLi, a first electrode connected to the second electrode of the first transistor T1 (or the third node N3), and a second electrode connected to the gate electrode of the first transistor T1 (or the first node N1).

The fourth transistor T4 may apply the initialization voltage VINT to the gate electrode of the first transistor T1 in response to a third scan signal GS3. In an embodiment, the fourth transistor T4 may include a gate electrode configured to receive the third scan signal GS3 from an $(i-1)^{th}$ inverted scan line/SL(i-1), a first electrode connected to the initialization voltage VINT, and a second electrode connected to the gate electrode of the first transistor T1 (or the first node N1).

The fifth transistor T5 may apply the first power supply voltage ELVDD to the first electrode of the first transistor T1 in response to the emission control signal. In an embodiment, the fifth transistor T5 may include a gate electrode configured to receive the emission control signal from an $i^{th}$ emission control line EMi, a first electrode connected to the first power supply voltage ELVDD, and a second electrode connected to the first electrode of the first transistor T1 (or the second node N2).

The sixth transistor T6 may connect the second electrode of the first transistor T1 to a first electrode of the organic light-emitting diode OLED in response to the emission control signal. In an embodiment, the sixth transistor T6 may include a gate electrode configured to receive the emission control signal from the $i^{th}$ emission control line EMi, a first electrode connected to the second electrode of the first transistor T1 (or the third node N3), and a second electrode connected to the first electrode of the organic light-emitting diode OLED (or a fourth node N4).

The seventh transistor T7 may apply the initialization voltage VINT to the first electrode of the organic light-emitting diode OLED in response to a fourth scan signal GS4. In an embodiment, the seventh transistor T7 may include a gate electrode configured to receive the fourth scan signal GS4 from the $(i-1)^{th}$ inverted scan line /SL(i-1), a first electrode connected to the initialization voltage VINT, and a second electrode connected to the first electrode of the organic light-emitting diode OLED (or the fourth node N4).

In an embodiment, each of the first transistor T1, the second transistor T2, the fifth transistor T5, and the sixth transistor T6 may be a polysilicon (poly-Si) thin film transistor, and may be a P-type transistor. In such an embodiment, each of the third transistor T3, the fourth transistor T4, and the seventh transistor T7 may be an oxide thin film transistor, and may be an N-type transistor.

The storage capacitor CST may include a first electrode connected to the first power supply voltage ELVDD, and a second electrode connected to the gate electrode of the first transistor T1 (or the first node N1).

Figure 3:
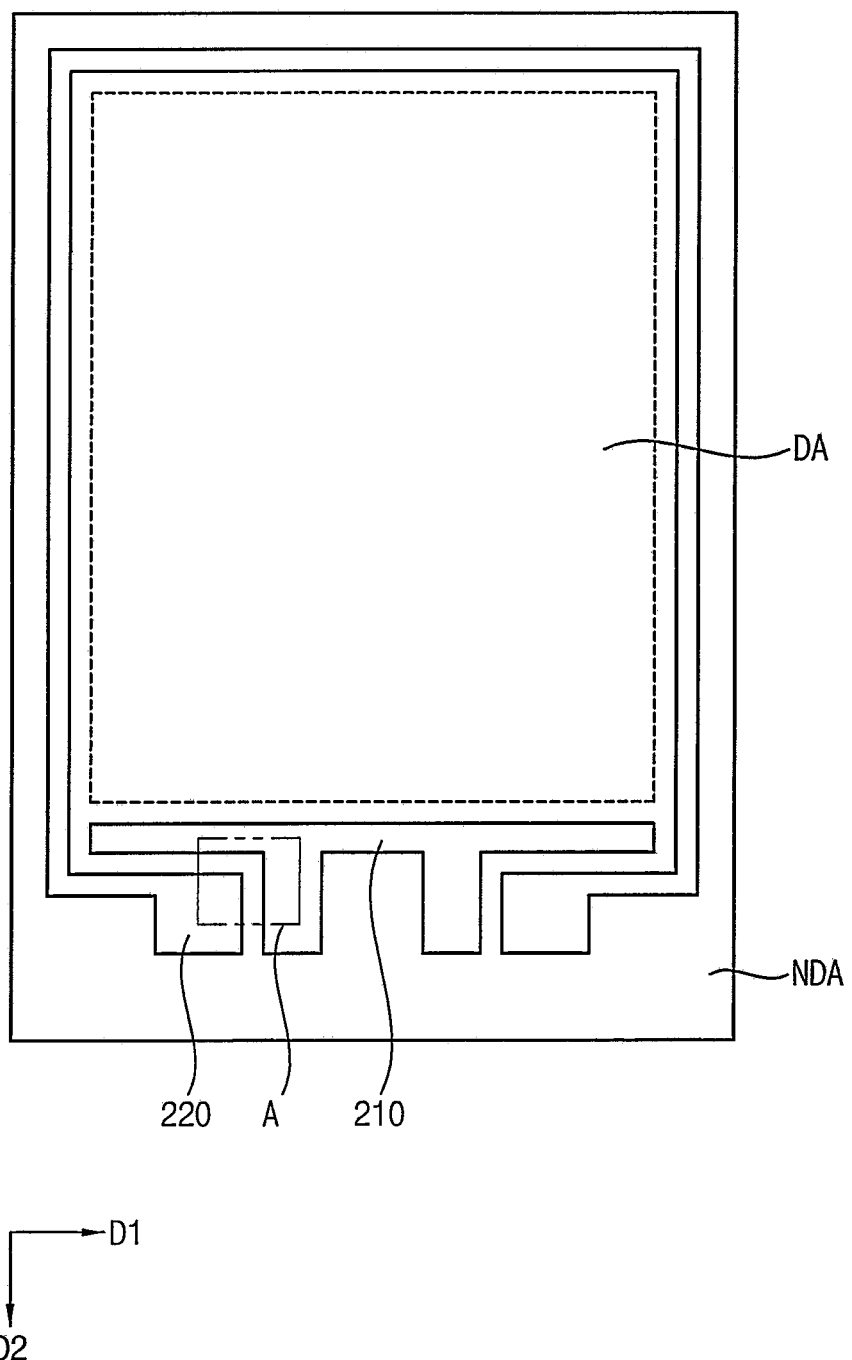
FIG. 3 is a plan view showing a display apparatus according to an embodiment.

FIG. 3 is a plan view showing a display apparatus according to an embodiment.

Referring to FIG. 3, an embodiment of a display apparatus may include a display area DA for displaying an image and a non-display area NDA surrounding the display area DA while being adjacent to the display area DA. The display apparatus may include a first power supply wire 210 and a second power supply wire 220.

The display area DA may be defined on a plane parallel to or defined by a first direction D1 and a second direction D2 perpendicular to the first direction D1. A plurality of pixels for displaying an image may be disposed in the display area DA, and the first power supply wire 210 and the second power supply wire 220 may be disposed in the non-display area NDA.

The first power supply voltage ELVDD may be applied to the first power supply wire 210. The second power supply voltage ELVSS may be applied to the second power supply wire 220. A horizontal portion of the first power supply wire 210 may extend in the first direction D1, and may be adjacent to the display area DA. A vertical portion of the first power supply wire 210 may extend from the horizontal portion of the first power supply wire 210 in the second direction D2. The second power supply wire 220 may extend to surround the display area DA, and may be spaced apart from the first power supply wire 210.

Figure 4:
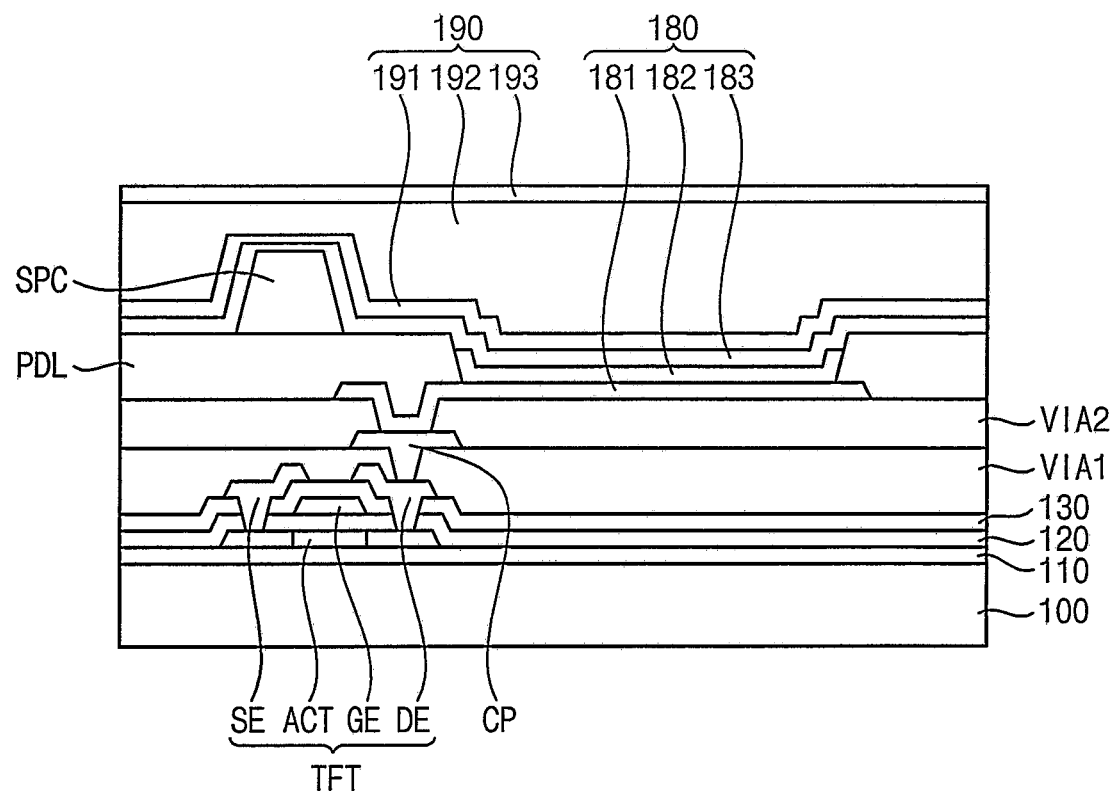
FIG. 4 is a sectional view corresponding to a pixel in a display area of the display apparatus of FIG. 3.

FIG. 4 is a sectional view corresponding to a pixel in a display area of the display apparatus of FIG. 3.

Referring to FIG. 4, an embodiment of the display apparatus may include a base substrate 100, a buffer layer 110, an active pattern ACT of a thin film transistor TFT, a first insulating layer 120, a gate conductive layer, a second insulating layer 130, a first source-drain conductive layer, a first via insulating layer VIA1, a second source-drain conductive layer, a second via insulating layer VIA2, a light-emitting structure 180, a pixel-defining layer PDL, a spacer layer SPC, a thin film encapsulation layer 190, and a touch screen panel layer (not shown).

The base substrate 100 may include or be formed of a transparent or opaque material. In one embodiment, for example, the base substrate 100 may include a quartz substrate, a synthetic quartz substrate, a calcium fluoride substrate, a fluorine-doped quartz substrate (F-doped quartz substrate), a soda lime glass substrate, a non-alkali glass substrates, or the like. In an embodiment, the base substrate 100 may be a transparent resin substrate having flexibility. In one embodiment, for example, where the base substrate 100 includes the transparent resin substrate, the base substrate 100 include a polyimide substrate.

The buffer layer 110 may be disposed over the whole base substrate 100. The buffer layer 110 may prevent metal atoms or impurities from diffusing from the base substrate 100 into the active pattern ACT, and may control a heat transfer rate during a crystallization process for forming the active pattern ACT to obtain a substantially uniform active pattern ACT. In an embodiment, where a surface of the base substrate 100 is not uniform, the buffer layer may serve to improve flatness of the surface of the base substrate 100.

The active pattern ACT may be disposed on the buffer layer 110. The active pattern ACT may include a drain region and a source region which are doped with impurities, and a channel region disposed between the drain region and the source region. In one embodiment, for example, the active pattern ACT may include poly crystal silicon.

The first insulating layer 120 may be disposed on the buffer layer 110 on which the active pattern ACT is disposed. The first insulating layer 120 may include an inorganic insulating material such as a silicon compound and a metal oxide.

The gate conductive layer may be disposed on the first insulating layer 120. The gate conductive layer may include or define a gate electrode GE of the thin film transistor TFT, which overlaps the active pattern ACT when viewed from a plan view in a thickness direction of the base substrate 100. The gate conductive layer may further include a signal wire such as a scan line (not shown) for driving the display apparatus.

The second insulating layer 130 may be disposed on the first insulating layer 120 on which the gate conductive layer is disposed. The second insulating layer 130 may include an inorganic insulating material such as a silicon compound and a metal oxide.

The first source-drain conductive layer may be disposed on the second insulating layer 130. The first source-drain conductive layer may include or define a source electrode SE and a drain electrode DE of the thin film transistor TFT. The first source-drain conductive layer may further include or define a first layer of the first power supply wire, and a first layer of the second power supply wire.

The first via insulating layer VIA1 may be disposed on the second insulating layer 130 on which the first source-drain conductive layer is disposed. The first via insulating layer VIA1 may be formed by using an organic material such as a photoresist, an acryl-based resin, a polyimide-based resin, a polyamide-based resin, and a siloxane-based resin.

The second source-drain conductive layer may be disposed on the first via insulating layer VIA1. The second source-drain conductive layer may include or define a contact pad CP electrically connected to the thin film transistor TFT. The second source-drain conductive layer may further include or define a second layer of the first power supply wire, and a second layer of the second power supply wire.

The second via insulating layer VIA2 may be disposed on the first via insulating layer VIA1 on which the second source-drain conductive layer is disposed. The second via insulating layer VIA2 may be formed by using an organic material such as a photoresist, an acryl-based resin, a polyimide-based resin, a polyamide-based resin, and a siloxane-based resin.

The light-emitting structure 180 may include a first electrode 181, a light-emitting layer 182, and a second electrode 183.

The first electrode 181 may be disposed on the second via insulating layer VIA2. In an embodiment, the first electrode 181 may be formed by using a reflective material or a transmissive material, which is selected based on a light-emitting scheme of the display apparatus. In an embodiment, the first electrode 181 may have a single-layer structure or a multilayer structure including a metal film, an alloy film, a metal nitride film, a conductive metal oxide film, and/or a transparent conductive material film.

The pixel-defining layer PDL may be disposed on the second via insulating layer VIA2 on which the first electrode 181 is disposed. The pixel-defining layer PDL may be formed by using an organic material, an inorganic material, or the like. In one embodiment, for example, the pixel-defining layer PDL may be formed by using a photoresist, a polyacryl-based resin, a polyimide-based resin, an acryl-based resin, a silicone compound, or the like. According to an embodiment, the pixel-defining layer PDL may be etched to form an opening that partially exposes the first electrode 181. An emission area and a non-emission area of the display apparatus may be defined by the opening of the pixel-defining layer PDL. In one embodiment, for example, a portion where the opening of the pixel-defining layer PDL is located may correspond to the emission area, and the non-emission area may correspond to a portion adjacent to the opening of the pixel-defining layer PDL.

The spacer layer SPC may be disposed on the pixel-defining layer PDL. The spacer layer SPC may maintain a gap between the touch screen panel layer and the light-emitting structure 180.

The light-emitting layer 182 may be disposed on the first electrode 181 exposed through the opening of the pixel-defining layer PDL. In an embodiment, the light-emitting layer 182 may extend onto a side wall of the opening of the pixel-defining layer PDL. In an embodiment, the light-emitting layer 182 may have a multilayer structure including an organic emission layer EL, a hole injection layer HIL, a hole transport layer HTL, an electron transport layer ETL, an electron injection layer EIL, or the like. In an alternative embodiment, a layer of the light-emitting layer 182 except for the organic emission layer, e.g., the hole injection layer, the hole transport layer, the electron transport layer, the electron injection layer, or the like, may be commonly formed to correspond to a plurality of pixels. The organic emission layer of the light-emitting layer 182 may be formed by using light-emitting materials for generating different color lights such as red light, green light, and blue light according to each of the pixels of the display apparatus. According to an alternative embodiment, the organic emission layer of the light-emitting layer 182 may have a structure in which a plurality of light-emitting materials for implementing different color lights such as red light, green light, and blue light are stacked to emit white light. In such an embodiment, the above light-emitting structures may be commonly formed to correspond to the pixels, and the pixels may be classified by a color filter layer.

The second electrode 183 may be disposed on the pixel-defining layer PDL and the light-emitting layer 182. In an embodiment, the second electrode 183 may include a transmissive material or a reflective material, which is selected based on the light-emitting scheme of the display apparatus. In the embodiments, the second electrode 183 may have a single-layer structure or a multilayer structure including a metal film, an alloy film, a metal nitride film, a conductive metal oxide film, and/or a transparent conductive material film.

The thin film encapsulation layer 190 may be disposed on the second electrode 183. The thin film encapsulation layer 190 may prevent moisture and oxygen from penetrating from an outside. The thin film encapsulation layer 190 may include at least one organic layer and at least one inorganic layer. The at least one organic layer and the at least one inorganic layer may be alternately stacked on each other. In an embodiment, as shown in FIG. 4, the thin film encapsulation layer 190 may include a first inorganic layer 191, an organic layer 192 disposed on the first inorganic layer 191, and a second inorganic layer 193 disposed on the organic layer 192, but the embodiments are not limited thereto.

The touch screen panel layer may be disposed on the thin film encapsulation layer 190. The touch screen panel layer may include a touch electrode and an insulating layer, and may be disposed directly on the thin film encapsulation layer 190.

Figure 5:
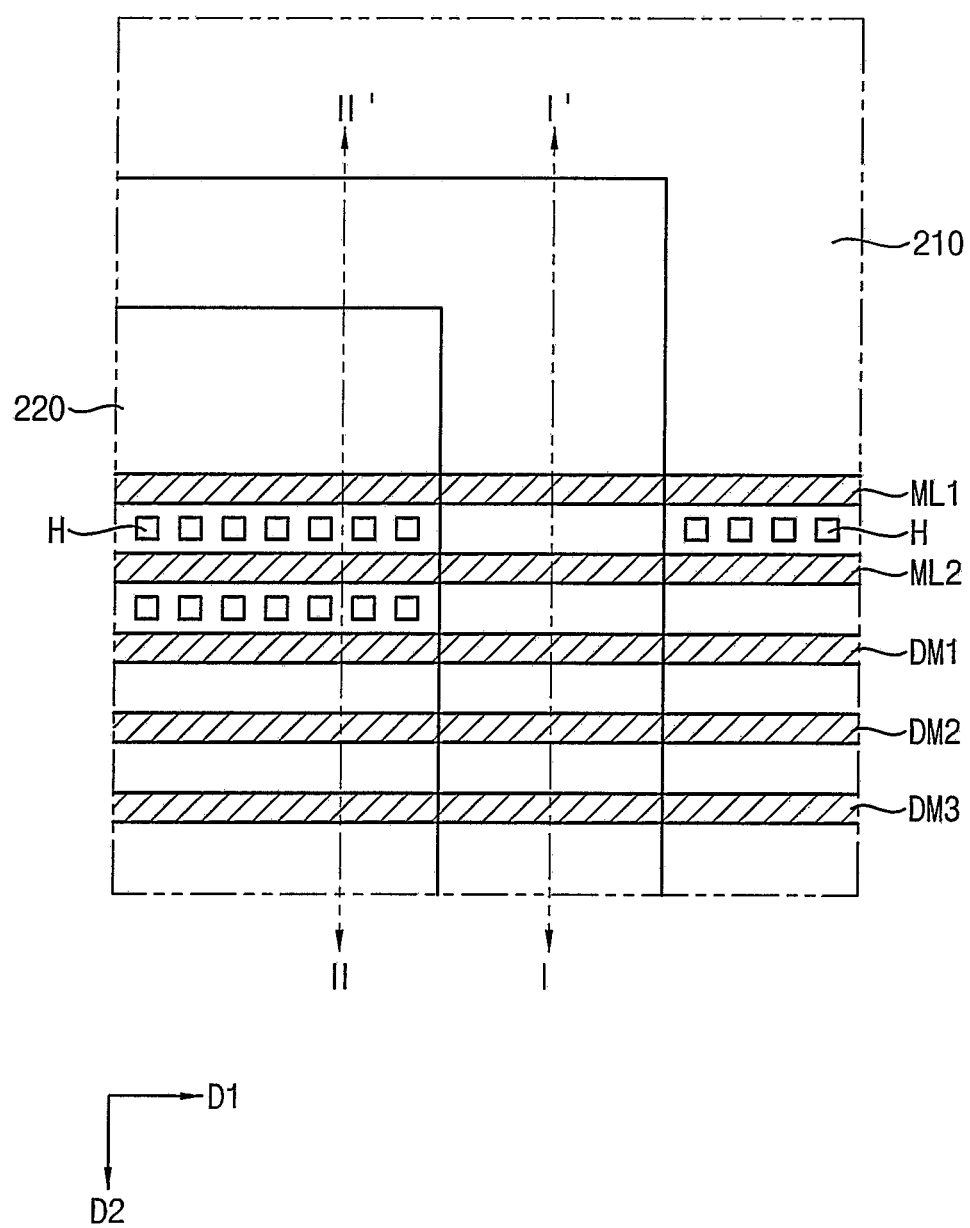
FIG. 5 is an enlarged view showing the portion A of FIG. 3.
Figure 6:
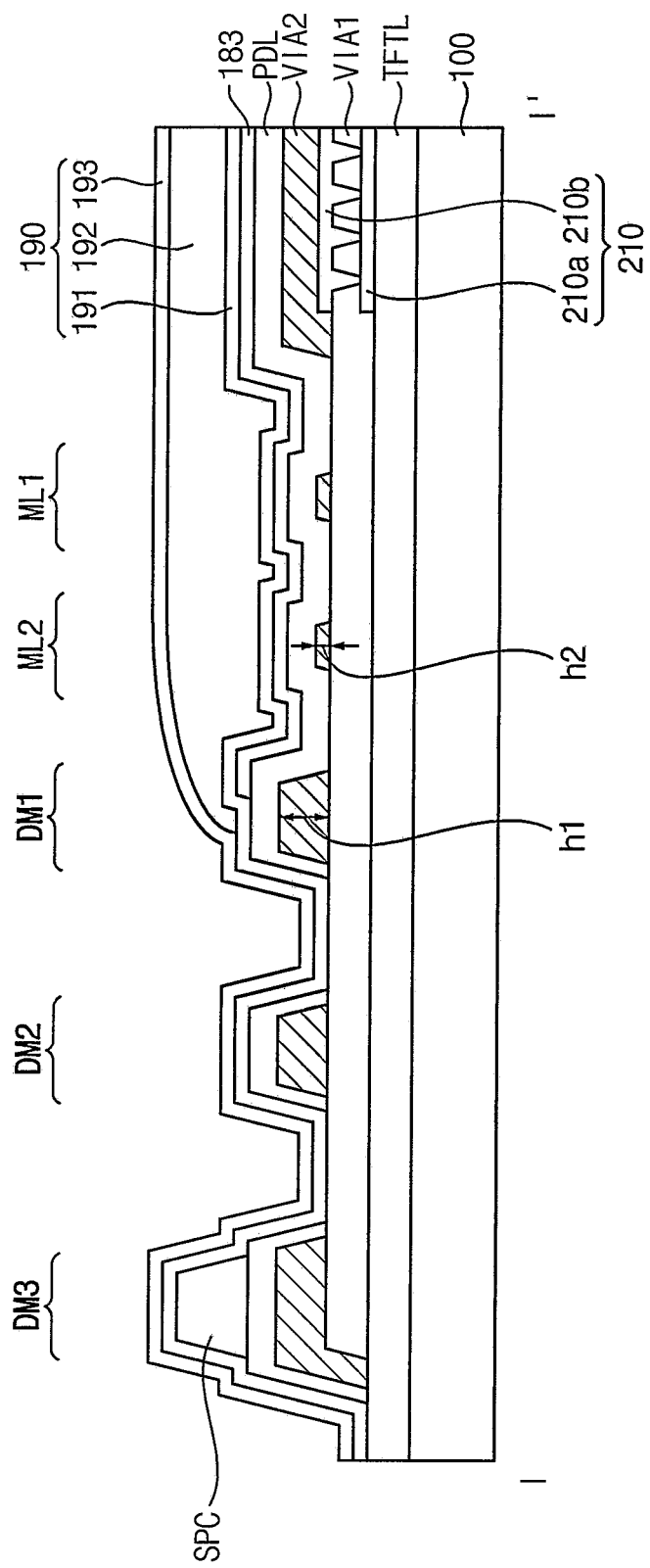
FIG. 6 is a sectional view taken along line I-I' of FIG. 5.
Figure 7:
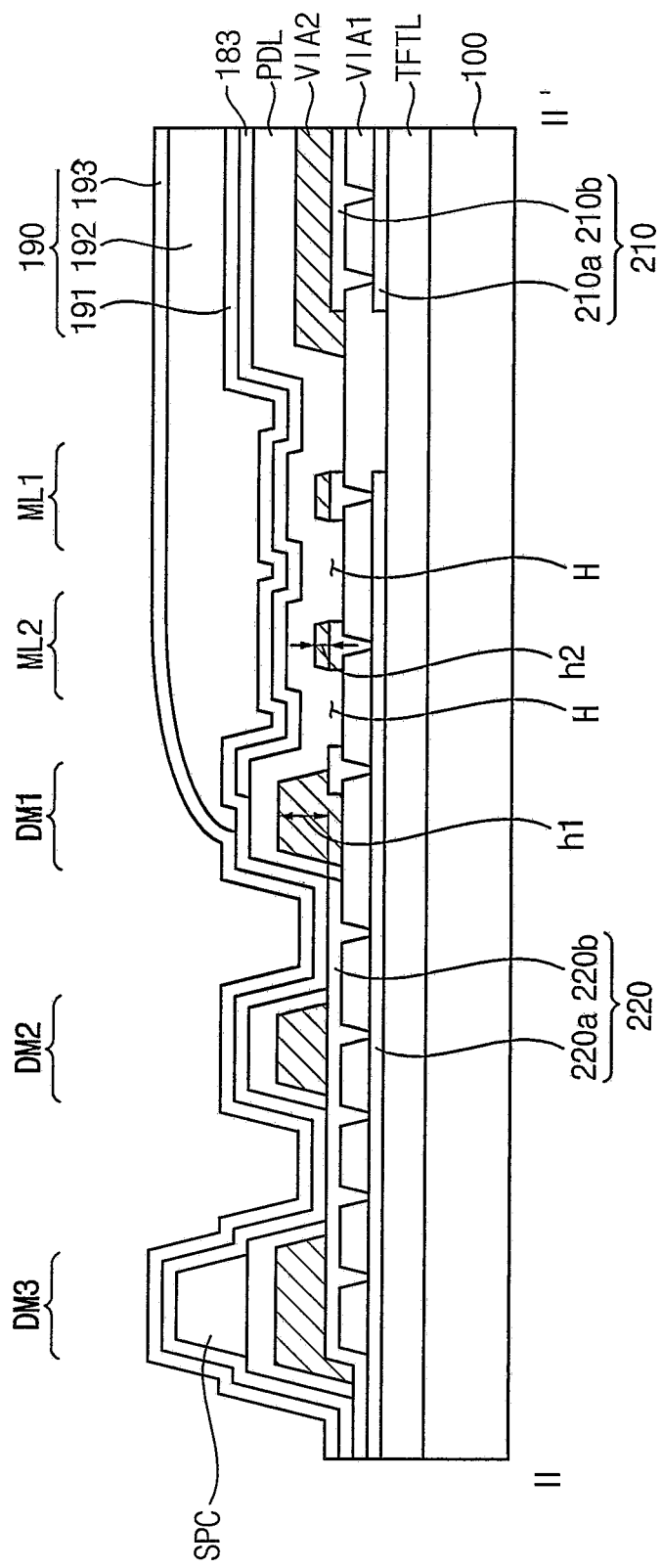
FIG. 7 is a sectional view taken along line II-II' of FIG. 5.

FIG. 5 is an enlarged view showing 'the portion A of FIG. 3. FIG. 6 is a sectional view taken along line I-I' of FIG. 5. FIG. 7 is a sectional view taken along line II-II' of FIG. 5.

Referring to FIGS. 3 to 7, an embodiment of the display apparatus may include the base substrate 100, a thin film transistor layer TFTL, the first power supply wire 210, the second power supply wire 220, the first via insulating layer VIA1, the second via insulating layer VIA2, the pixel-defining layer PDL, the second electrode 183, and the thin film encapsulation layer 190. The thin film encapsulation layer 190 may include a first inorganic layer 191, an organic layer 192, and a second inorganic layer 193.

The thin film transistor layer TFTL may include the thin film transistor TFT and insulating layers (e.g., the buffer layer 110, the first insulating layer 120, and the second insulating layer 130).

The first power supply wire 210 may include a first layer 210*a* and a second layer 210*b*. The second power supply wire 220 may include a first layer 220*a* and a second layer 220*b*. The first layer 210*a* of the first power supply wire 210 and the first layer 220*a* of the second power supply wire 220 may be included in or defined by the first source-drain conductive layer. The second layer 210*b* of the first power supply wire 210 and the second layer 220*b* of the second power supply wire 220 may be included in or defined by the second source-drain conductive layer.

In an embodiment, as shown in FIGS. 3 and 5, a third dam DM3 extending in the first direction D1 along the non-display area NDA may be disposed on the first power supply wire 210 and the second power supply wire 220. In such an embodiment, a second dam DM2 and a first dam DM1, each extending in the first direction D1, may be disposed between the third dam DM3 and the display area DA. Thus, in such an embodiment the first dam DM1, the second dam DM2, and the third dam DM3 may be sequentially disposed in the second direction D2 from the display area DA.

The first to third dams DM1, DM2, and DM3 may surround the display area DA of the display apparatus, and may overlap the first power supply wire 210 and the second power supply wire 220. Thus, the first to third dams DM1, DM2, and DM3 may extend in the first direction D1 at a portion where the first power supply wire 210 and the second power supply wire 220 extend in the second direction D2. The first to third dams DM1, DM2, and DM3 may be configured to prevent overflow by controlling a flow of an organic material when the organic layer 192 of the thin film encapsulation layer 190 is formed. In an embodiment, three dams may be sequentially formed, but not being limited thereto. In such an embodiment, a shape of each of the dams and a number of the dams may be variously modified.

In an embodiment, the first dam DM1 may be disposed on the first via insulating layer VIA1, and may include the second via insulating layer VIA2 and the pixel-defining layer PDL. The second dam DM2 may be disposed on the first via insulating layer VIA1, and may include the second via insulating layer VIA2 and the pixel-defining layer PDL. The third dam DM3 may be disposed on the first via insulating layer VIA1, and may include the second via insulating layer VIA2, the pixel-defining layer PDL, and the spacer layer SPC. Accordingly, in such an embodiment, the third dam DM3 may have a height greater than a height of the second dam DM2 or the first dam DM1. Herein, a height of a dam may be defined as a distance of an uppermost surface thereof from an uppermost surface of a layer therebelow, e.g., the second via insulating layer VIA2, in the thickness direction of the base substrate 100.

A first stacked structure ML1 disposed on the first via insulating layer VIA1 and having a height less than the height of the first dam DM1 may be defined or formed between the first dam DM1 and the display area DA. The first stacked structure ML1 may include a portion of the second via insulating layer VIA2 and a portion of the pixel-defining layer PDL. Thus, the first stacked structure ML1 may include a plurality of layers, each including an organic material.

A second stacked structure ML2 disposed on the first via insulating layer VIA1 and having a height less than the height of the first dam DM1 may be defined or formed between the first stacked structure ML1 and the first dam DM1. The second stacked structure ML2 may include a portion of the second via insulating layer VIA2 and a portion of the pixel-defining layer PDL. Thus, the second stacked structure ML2 may include a plurality of layers, each including an organic material.

The second via insulating layer VIA2 may have a first height h1 at the first dam DM1, and may have a second height h2 less than the first height h1 at the first stacked structure ML1 and the second stacked structure ML2. The second via insulating layer VIA2 may be formed by using a halftone mask or the like to have portions having different heights from each other.

The second electrode 183 may overlap a substantially entire portion of the first stacked structure ML1, a substantially entire portion of the second stacked structure ML2, and at least a portion of the first dam DM1.

The first inorganic layer 191 may be disposed on the second electrode 183, the pixel-defining layer PDL, the second via insulating layer VIA2, and the first via insulating layer VIA1. The organic layer 192 may be disposed on the first inorganic layer 191. The organic layer 192 may overlap a substantially entire portion of the first stacked structure ML1, a substantially entire portion of the second stacked structure ML2, and at least a portion of the first dam DM1. The second inorganic layer 193 may be disposed on the organic layer 192.

In an embodiment, as shown in FIG. 5, a plurality of holes H may be defined or formed in the second layer 210*b* of the first power supply wire 210 and the second layer 220*b* of the second power supply wire 220. The holes H may be located between the first stacked structure ML1 and the second stacked structure ML2 and between the second stacked structure ML2 and the first dam DM1. The hole H may be used as a passage through which an out-gas of the first via insulating layer VIA1 disposed under the second source-drain conductive layer is discharged in a manufacturing process of the display apparatus, and shapes of outer peripheries of the first stacked structure ML1 and the second stacked structure ML2 may be more clearly defined by using a curvature of a top surface of the second via insulating layer VIA2 due to the hole H, so that discrimination may be easily performed in an inspecting operation that will be described below.

Figure 8:
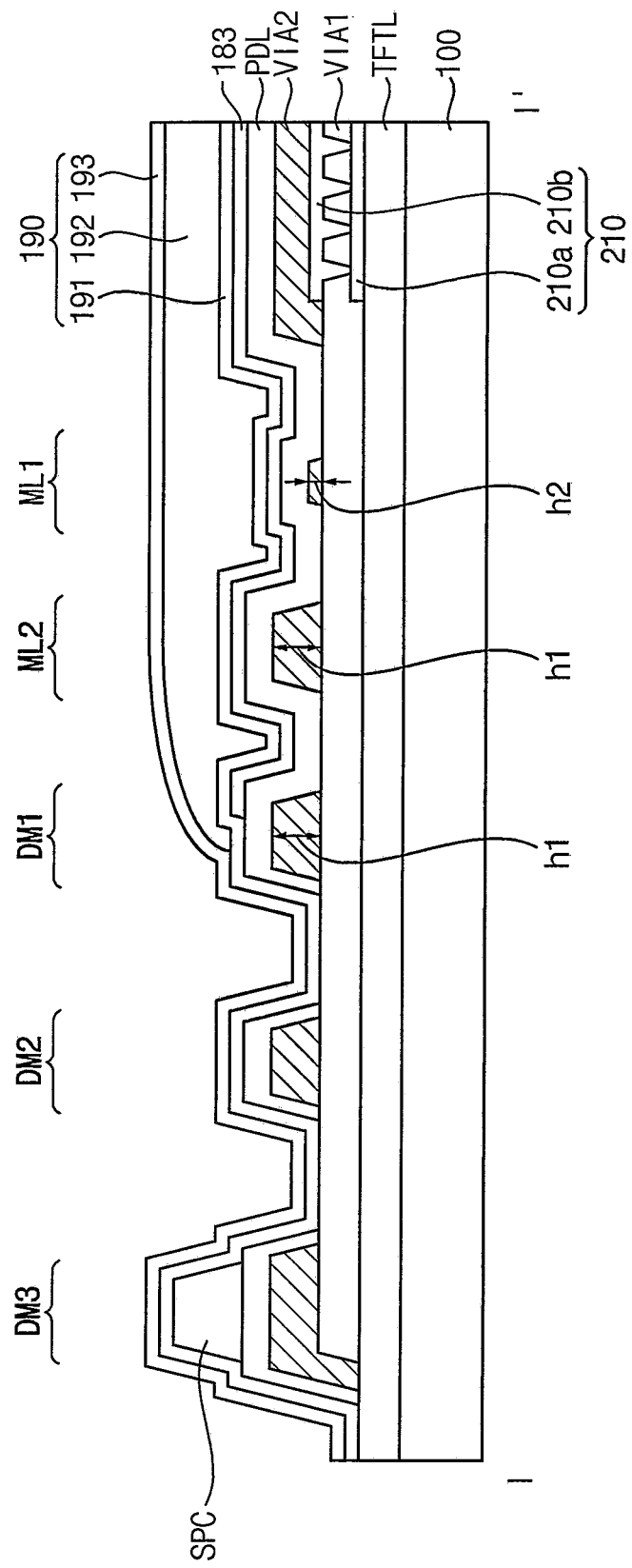
FIG. 8 is a sectional view showing a portion of a display apparatus according to an alternative embodiment.

FIG. 8 is a sectional view showing a portion of a display apparatus according to an alternative embodiment.

The display apparatus shown in FIG. 8 is substantially the same as the display apparatus of FIGS. 3 to 7 except that the height of the second stacked structure ML2 is different from the height of the first stacked structure ML1. The same or like elements shown in FIG. 8 have been labeled with the same reference characters as used above to describe the embodiment of the display apparatus of FIGS. 3 to 7, and any repetitive detailed description thereof will hereinafter be omitted or simplified.

In such an embodiment, as shown in FIG. 8, the second via insulating layer VIA2 may have a first height h1 at the first dam DM1 and the second stacked structure ML2, and may have a second height h2 less than the first height h1 at the first stacked structure ML1. Although not shown, the first stacked structure ML1, the second stacked structure ML2, and the first dam DM1 may have different heights from each other.

Figure 9:
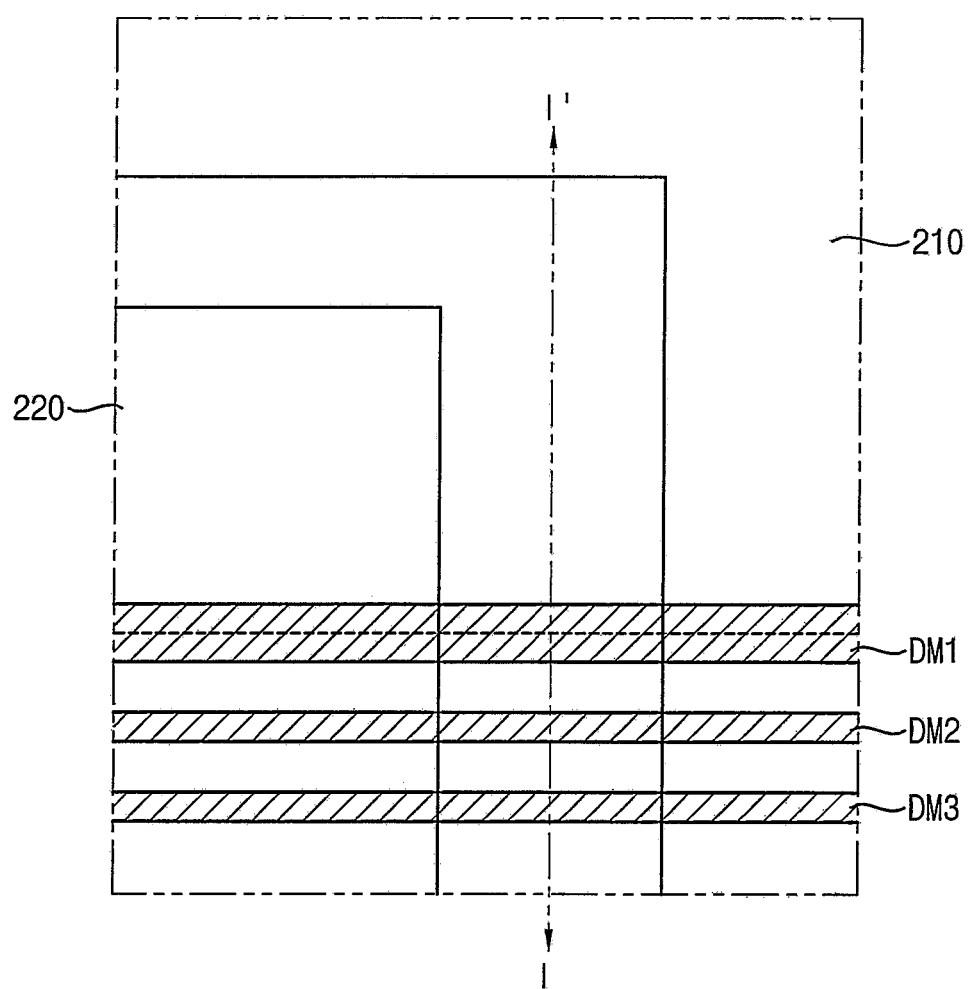
FIG. 9 is a plan view showing a portion of a display apparatus according to an alternative embodiment.
Figure 10:
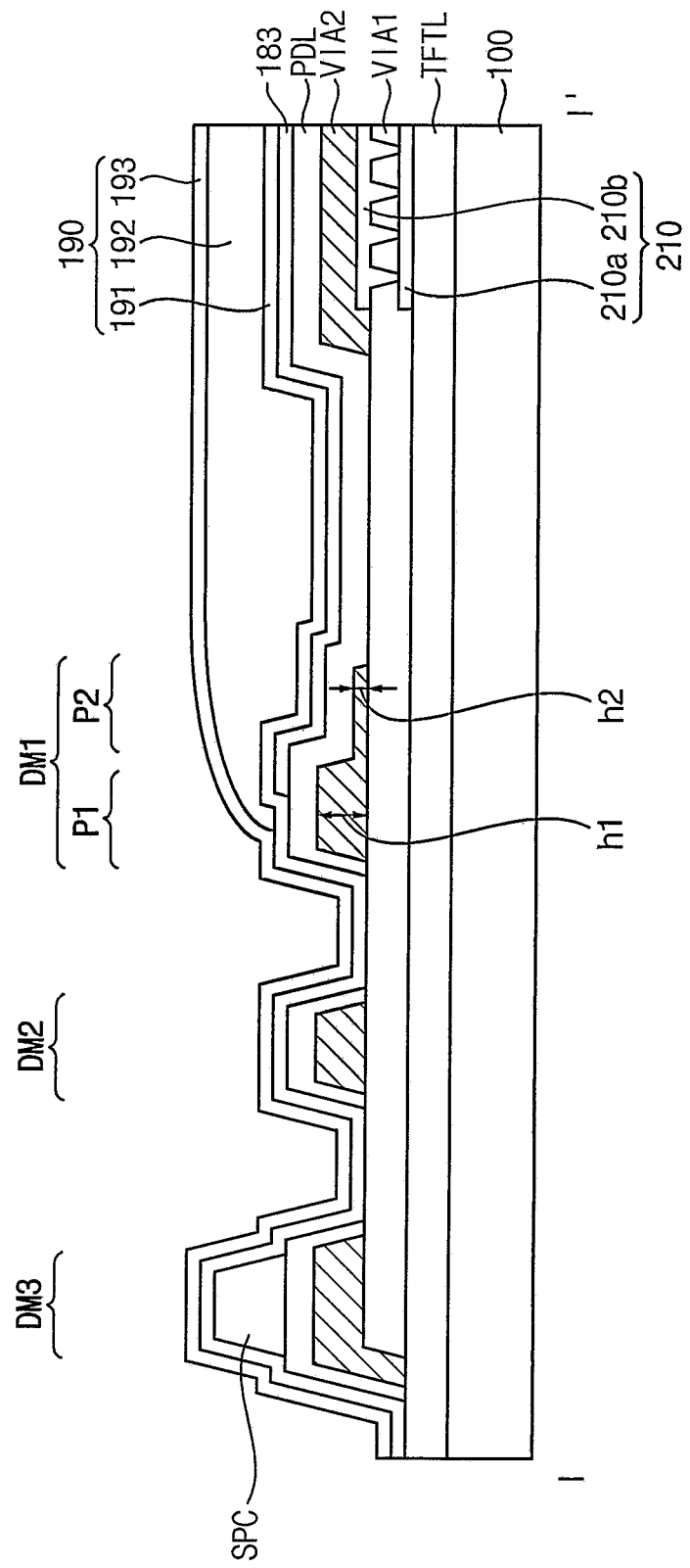
FIG. 10 is a sectional view taken along line I-I' of FIG. 9.

FIG. 9 is a plan view showing a portion of a display apparatus according to an alternative embodiment. FIG. 10 is a sectional view taken along line I-I' of FIG. 9.

The display apparatus shown in FIGS. 9 and 10 is substantially the same as the display apparatus of FIGS. 3 to 7 except that a step is formed in the first dam instead of the first and second stacked structures. The same or like elements shown in FIGS. 9 and 10 have been labeled with the same reference characters as used above to describe the embodiment of the display apparatus of FIGS. 3 to 7, and any repetitive detailed description thereof will hereinafter be omitted or simplified.

In an embodiment, as shown in FIGS. 9 and 10, the first dam DM1 may include a first portion P1 and a second portion P2. The first portion P1 may have a height greater than a height of the second portion P2. In one embodiment, for example, the second via insulating layer VIA2 corresponding to the first portion P1 may have a first height h1, and the second via insulating layer VIA2 corresponding to the second portion P2 may have a second height h2 less than the first height h1.

Figure 11:
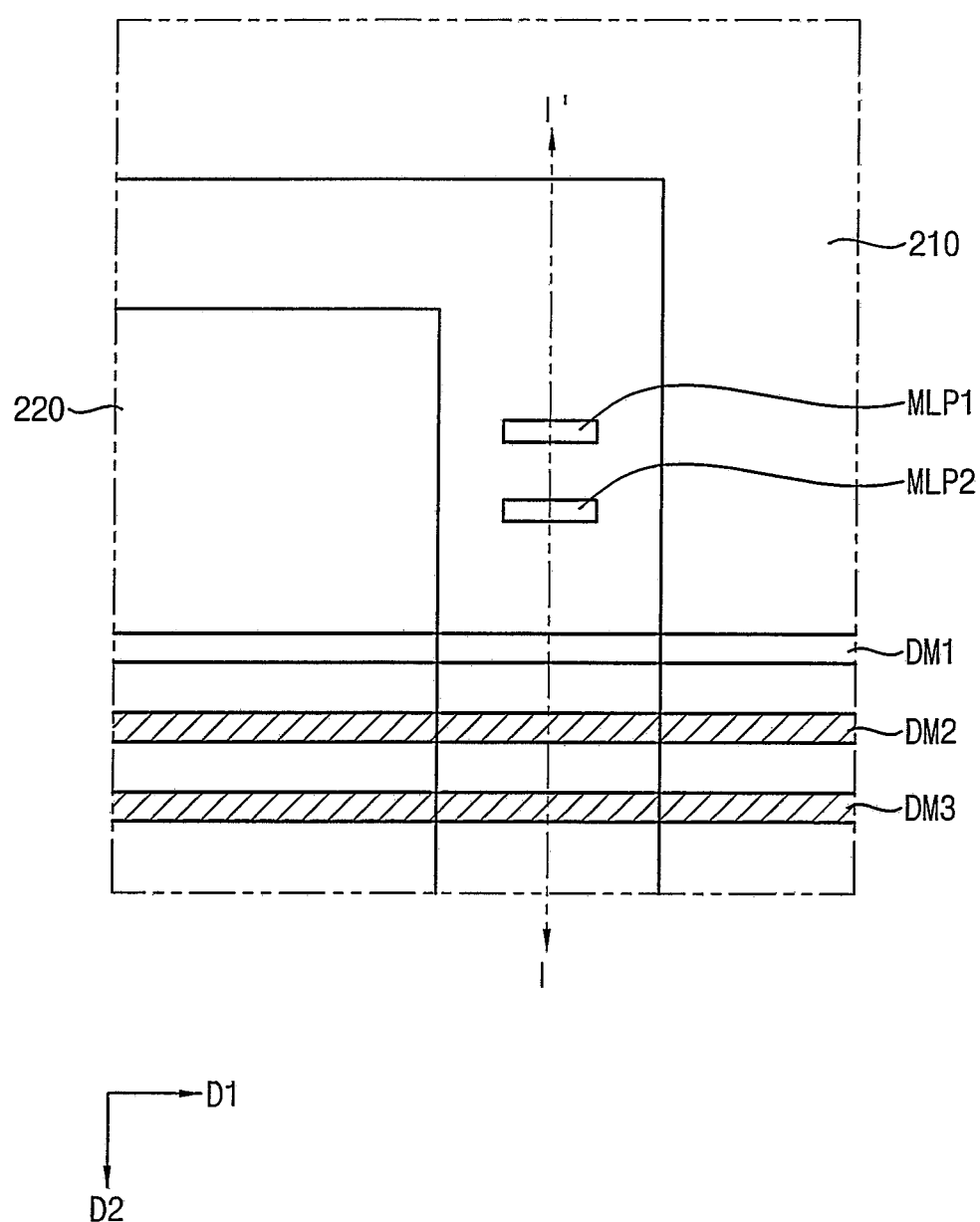
FIG. 11 is a plan view showing a portion of a display apparatus according to another alternative embodiment.

FIG. 11 is a plan view showing a portion of a display apparatus according to another alternative embodiment.

The display apparatus shown in FIG. 11 is substantially the same as the display apparatus of FIGS. 3 to 7 except that a first stacked structure pattern MLP1 and a second stacked structure pattern MLP2 are formed instead of the first and second stacked structures, respectively. The same or like elements shown in FIG. 11 have been labeled with the same reference characters as used above to describe the embodiment of the display apparatus of FIGS. 3 to 7, and any repetitive detailed description thereof will hereinafter be omitted or simplified.

In such an embodiment, the first stacked structure pattern MLP1 and the second stacked structure pattern MLP2 may not overlap the first power supply wire 210 and the second power supply wire 220. The first stacked structure pattern MLP1 and the second stacked structure pattern MLP2 may be formed at a specific position in the form of a pattern so that visibility degrees of outer peripheries of the first stacked structure pattern MLP1 and the second stacked structure pattern MLP2 may be easily checked or detected. The first stacked structure pattern MLP1 and the second stacked structure pattern MLP2 may be formed on the first via insulating layer by using the second via insulating layer and the pixel-defining layer as in the display apparatus of FIGS. 3 to 7.

Figure 12:
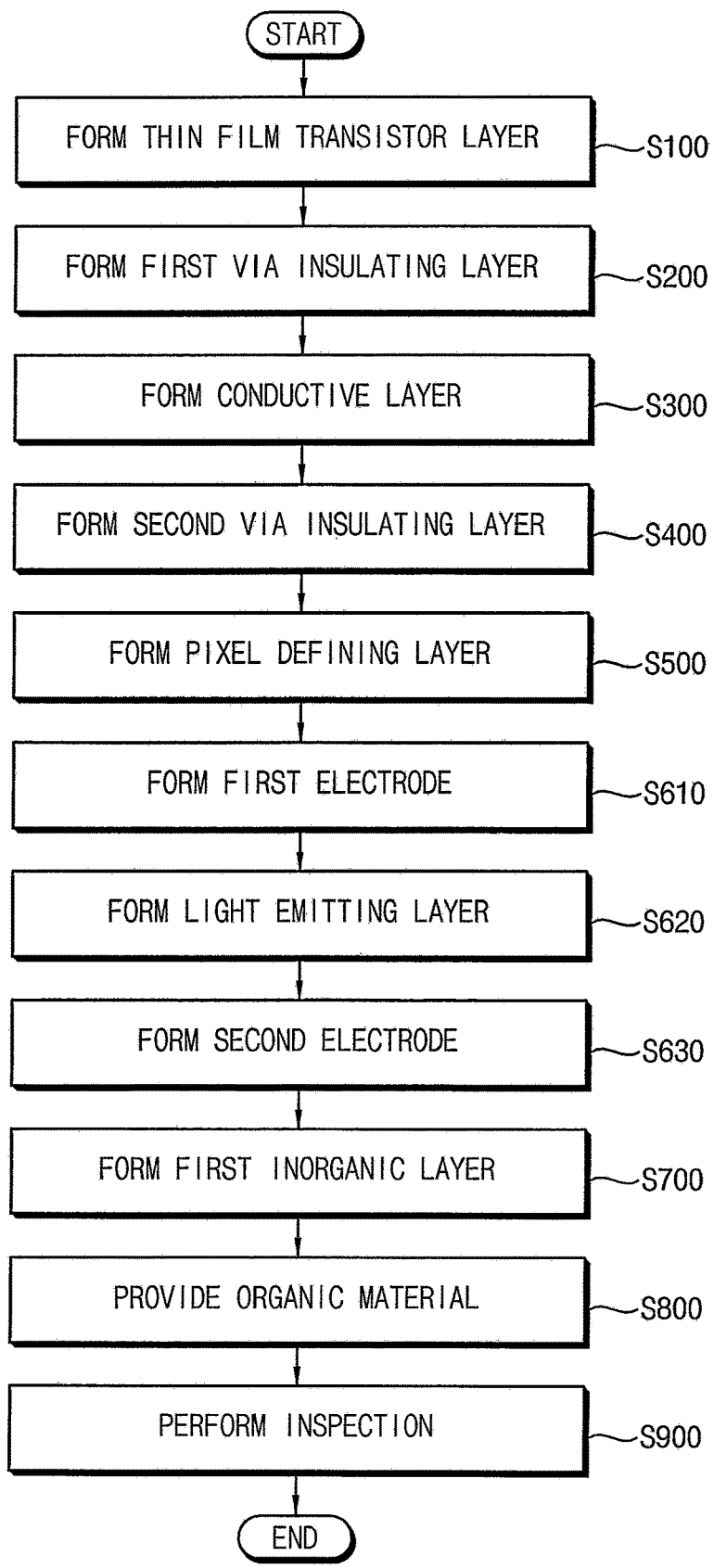
FIG. 12 is a flowchart showing a method of manufacturing a display apparatus according to an embodiment.

FIG. 12 is a flowchart showing a method of manufacturing a display apparatus according to an embodiment.

Referring to FIG. 12, an embodiment of a method of manufacturing a display apparatus may include: forming (or providing) a thin film transistor layer (S100); forming a first via insulating layer (S200); forming a conductive layer (S300); forming a second via insulating layer (S400); forming a pixel-defining layer (S500); forming a first electrode (S610); forming a light-emitting layer (S620); forming a second electrode (S630); forming a first inorganic layer (S700); providing an organic material (S800); and performing inspection (S900).

The display apparatus including a display area for displaying an image and a non-display area adjacent to the display area may be manufactured.

In the forming of the thin film transistor layer (S100), the thin film transistor layer including a thin film transistor and an insulating layer may be provided or formed on a base substrate. The thin film transistor layer may include a buffer layer, an active pattern, a first insulating layer, a gate conductive layer, a second insulating layer, and a first source-drain conductive layer, but embodiments are not limited thereto. The thin film transistor layer may have one of various known structures.

In the forming of the first via insulating layer (S200), the first via insulating layer may be provided or formed on the thin film transistor layer.

In the forming of the conductive layer (S300), the conductive layer including a power supply wire may be provided or formed on the first via insulating layer. A plurality of holes may be formed in the power supply wire, and the holes may be located between a first stacked structure and a second stacked structure and between the second stacked structure and a first dam.

In the forming of the second via insulating layer (S400), the second via insulating layer may be provided or formed on the first via insulating layer on which the conductive layer is formed.

A portion of the second via insulating layer may constitute the first dam disposed in the non-display area to surround the display area. A portion of the second via insulating layer may constitute the first stacked structure disposed between the first dam and the display area in the non-display area. A portion of the second via insulating layer may constitute a second stacked structure disposed between the first stacked structure and the display area in the non-display area.

In the forming of the pixel-defining layer (S500), the pixel-defining layer may be provided or formed on the second via insulating layer and the first via insulating layer.

The first stacked structure may include a portion of the pixel-defining layer. The second stacked structure may include a portion of the pixel-defining layer. A height of the first dam may be greater than a height of each of the first stacked structure and the second stacked structure.

In the forming of the first electrode (S610), the first electrode may be formed in the display area on the second via insulating layer on which the pixel-defining layer is formed.

In the forming of the light-emitting layer (S620), the light-emitting layer may be formed on the first electrode.

In the forming of the second electrode (S630), the second electrode may be formed on the light-emitting layer. In such an embodiment, the second electrode may overlap a substantially entire portion of the first stacked structure and at least a portion of the first dam.

In the forming of the first inorganic layer (S700), the first inorganic layer may be provided or formed on the base substrate on which the second via insulating layer is formed.

In the providing of the organic material (S800), the organic material may be provided onto the first inorganic layer.

The organic material may include or be formed of a monomer that is an organic compound. In one embodiment, for example, the organic material may include methacrylate, acrylate, epoxy, or the like. The monomer in a liquid state may be formed through a printing process or the like. In such an embodiment, the printing process may include inkjet printing, screen printing, gravure printing, offset printing, flexo printing, or the like, but embodiments are not limited thereto.

In an embodiment, the monomer in the liquid state may flow and spread on the base substrate. In such an embodiment, an excessive flow may be controlled by the first dam DM1.

In the performing of the inspection (S900), a spreading degree of the organic material that spreads along a top surface of the first inorganic layer may be inspected by using a visibility degree of an outer periphery of the first stacked structure.

In an embodiment, when a visibility degree of an outer periphery of the second stacked structure is lowered after the visibility degree of the outer periphery of the first stacked structure is lowered, the spreading degree of the organic material may be determined to reach an appropriate or predetermined level.

The organic material provided onto the base substrate may spread from the display area to the first dam through the first stacked structure and the second stacked structure to form an organic layer. In this case, when the organic material covers the outer periphery of the first stacked structure, the outer periphery of the first stacked structure may be blurred, and visibility of the outer periphery of the first stacked structure may be lowered. Since the first stacked structure has an organic material stacked structure, the organic layer may cover the first stacked structure, so that a degree of light reflection on an inclined surface of the first stacked structure, which is the outer periphery of the first stacked structure, may be changed. Accordingly, the visibility of the outer periphery may be lowered, which may be checked through visual inspection or camera image inspection (see FIG. 14).

Then, a second inorganic layer may be formed on the organic layer, and a touch screen panel layer or the like may be additionally provided or formed, so that the display apparatus may be manufactured.

Figure 13A:
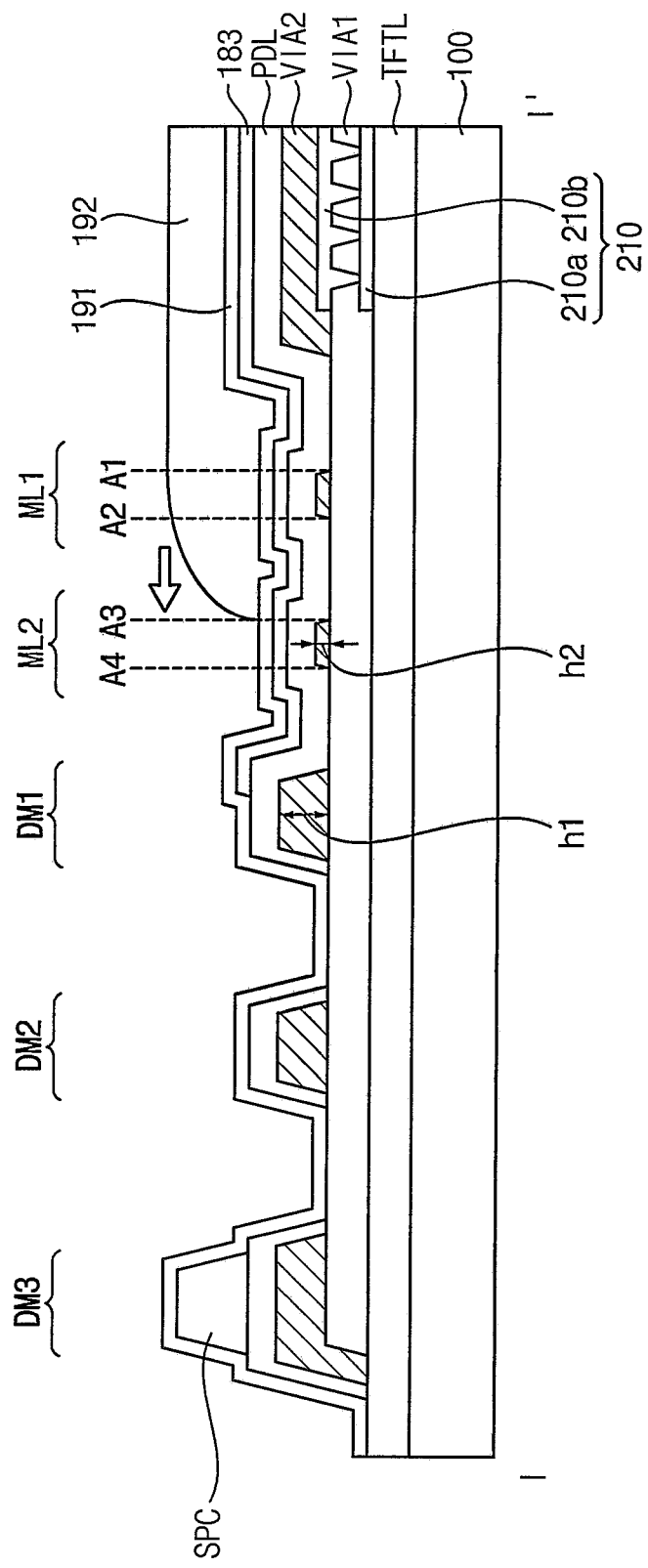
FIGS. 13A and 13B are sectional views showing forming of an organic layer in the method of manufacturing the display apparatus according to an embodiment.
Figure 13B:
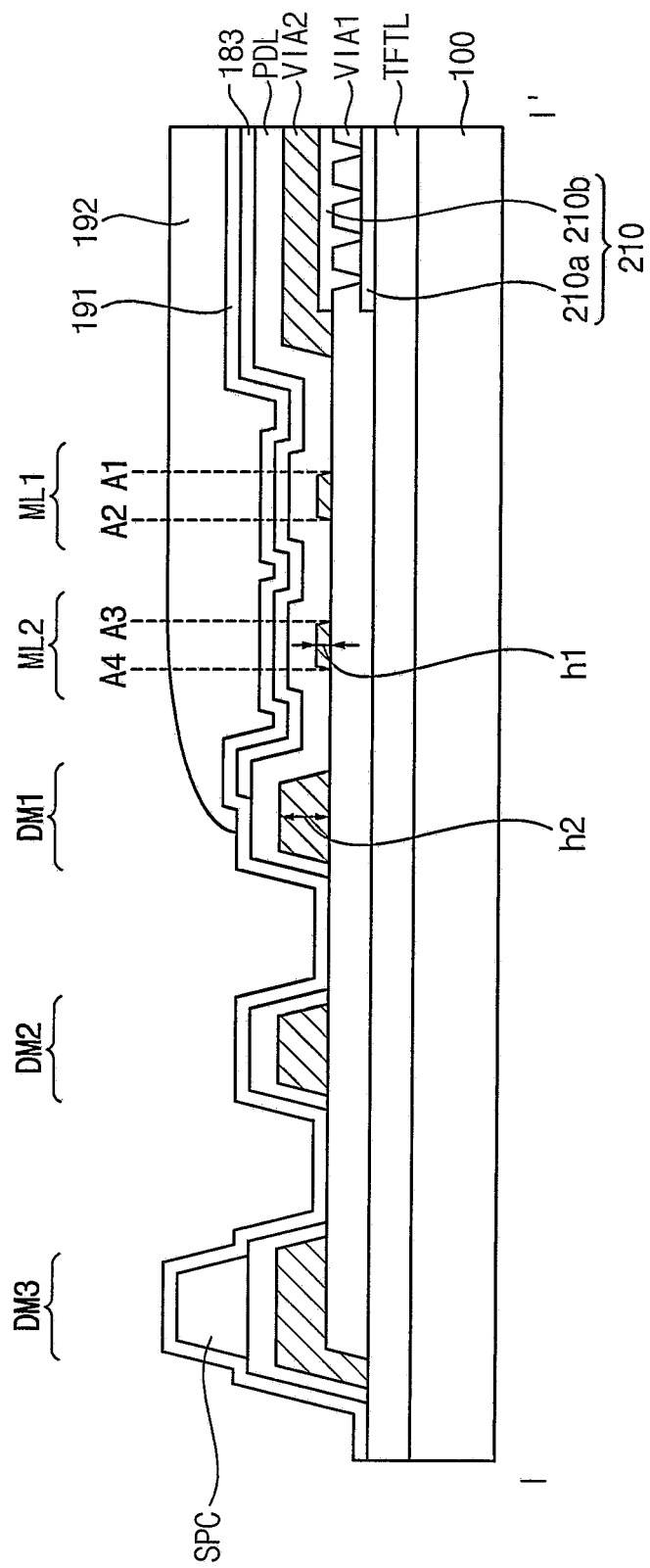
Figure 14A:
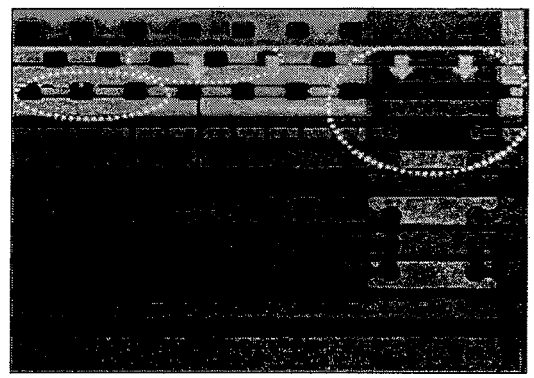
FIGS. 14A, 14B and 14C are photographs showing a visibility degree of a stacked structure and a coverage degree of the organic layer in the forming of the organic layer of the display apparatus according to an embodiment.
Figure 14B:
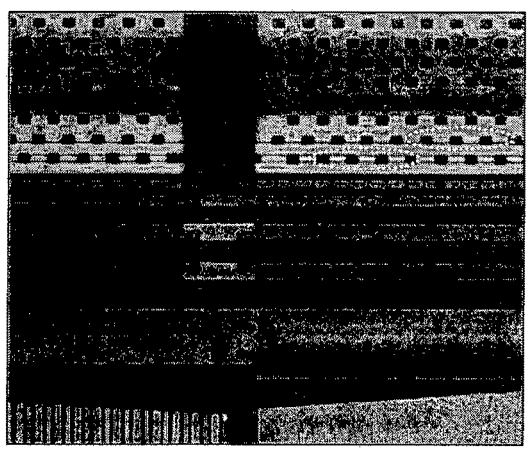
Figure 14C:
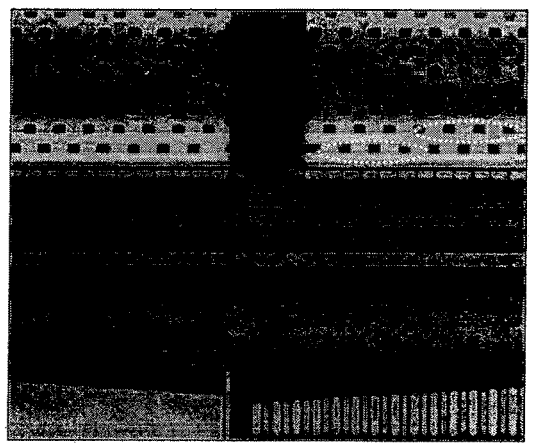

FIGS. 13A and 13B are sectional views showing forming of an organic layer in the method of manufacturing the display apparatus according to an embodiment. FIGS. 14A, 14B and 14C are photographs showing a visibility degree of a stacked structure and a coverage degree of the organic layer in the forming of the organic layer of the display apparatus according to an embodiment. Particularly, FIG. 14A shows a substrate with stacked structures before the organic layer is formed. FIG. 14B shows the substrate with an organic material spreading thereon. FIG. 14C shows the substrate after the organic layer is formed.

Referring to FIGS. 13A to 14A, before the organic layer is formed, the outer peripheries of the first stacked structure ML1 and the second stacked structure ML2 may be visually recognized at a relatively clear level.

When the organic material is provided onto the first inorganic layer 191 to form the organic layer, the organic material may spread through the first stacked structure ML1 and the second stacked structure ML2 to the first dam DM1 along an arrow shown in the drawing (see FIGS. 13A and 13B).

As the organic material spreads, the visibility degrees of the outer peripheries of the first stacked structure ML1 and the second stacked structure ML2 may be sequentially decreased (see A1, A2, A3, and A4 in FIGS. 13A and 13B). In one embodiment, for example, as shown in FIG. 13A, lines A1 and A2 may not be visually recognized, the outer periphery on a line A3 may begin to smudge (see FIG. 14B), and a line A4 may be visually recognized. In FIG. 13B, none of the lines A1, A2, A3, and A4 may be visually recognized (see FIG. 14C), so that the spreading degree of the organic material may be determined to reach an appropriate or predetermined level.

Accordingly, a degree of formation of the organic layer 192 including the organic material may be easily inspected, and the manufacturing quality of the organic layer 192 may be improved.

Figure 15:
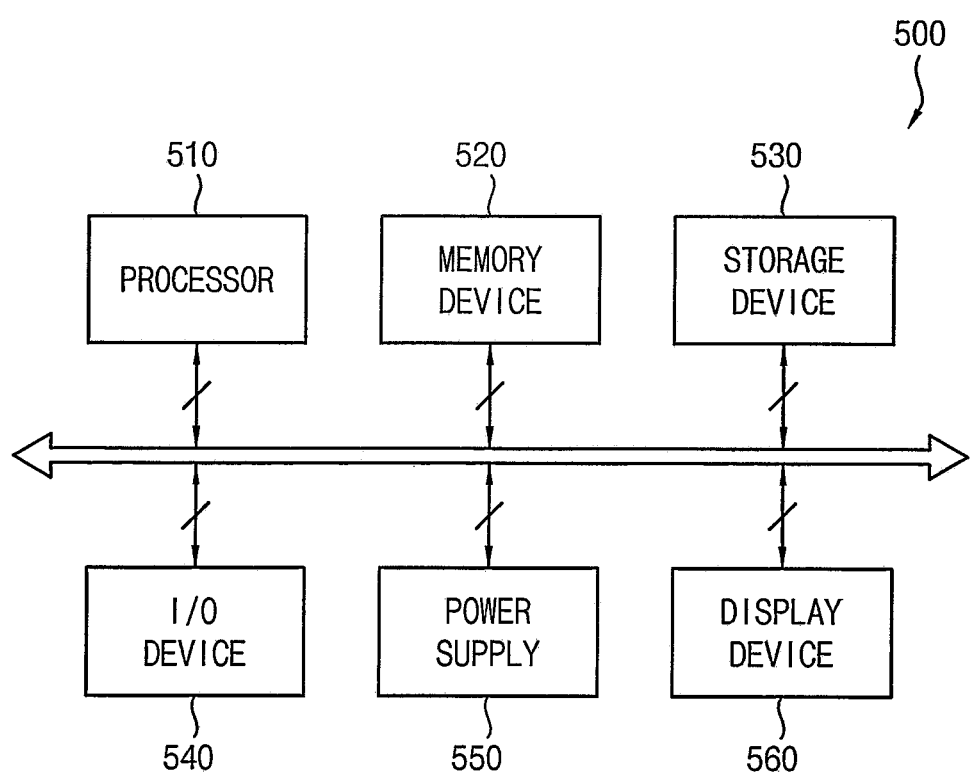
FIG. 15 is a block diagram showing an electronic device according to an embodiment of the invention.
Figure 16A:
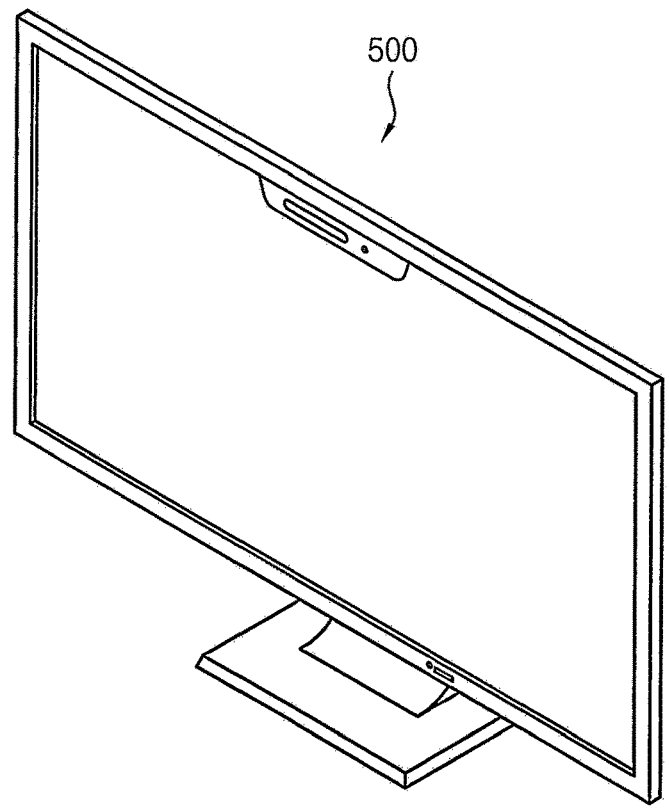
FIG. 16A is a view showing an embodiment in which the electronic device of FIG. 15 is implemented as a television.
Figure 16B:
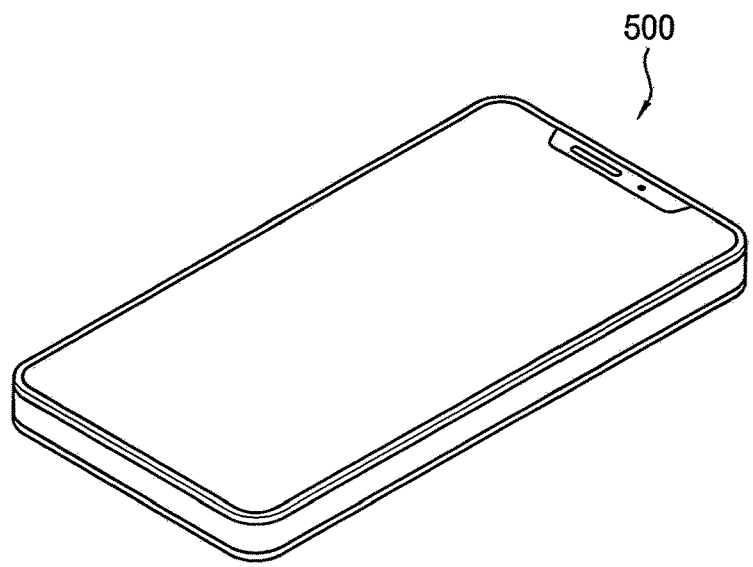
FIG. 16B is a view showing an embodiment in which the electronic device of FIG. 15 is implemented as a smartphone.

FIG. 15 is a block diagram showing an electronic device according to embodiments of the invention. FIG. 16A is a view showing an embodiment in which the electronic device of FIG. 15 is implemented as a television. FIG. 16B is a view showing an embodiment in which the electronic device of FIG. 15 is implemented as a smartphone.

Referring to FIGS. 15 to 16B, an embodiment of an electronic device 500 may include a processor 510, a memory device 520, a storage device 530, an input/output ("I/O") device 540, a power supply 550, and a display device 560. In such an embodiment, the display device 560 may correspond to the display apparatus of FIG. 1. The electronic device 500 may further include at least one selected from various ports for communicating with a video card, a sound card, a memory card, a USB device, and the like, or communicating with other systems. In an embodiment, as shown in FIG. 16A, the electronic device 500 may be implemented as a television. In an alternative embodiment, as shown in FIG. 16B, the electronic device 500 may be implemented as a smartphone. However, the embodiments shown in FIGS. 16A and 16B are merely exemplary, and the electronic device 500 is not limited thereto. In one embodiment, for example, the electronic device 500 may also be implemented as a mobile phone, a video phone, a smart pad, a smart watch, a tablet personal computer ("PC"), a vehicle navigation system, a computer monitor, a laptop computer, a head-mounted display ("HMD"), or the like.

The processor 510 may perform particular calculations or tasks. In an embodiment, the processor 510 may be a microprocessor, a central processing unit ("CPU"), an application processor ("AP"), or the like. The processor 510 may be connected to other components through an address bus, a control bus, a data bus, or the like. In an embodiment, the processor 510 may also be connected to an expansion bus such as a peripheral component interconnect ("PCI") bus. The memory device 520 may store data used for operations of the electronic device 500. In one embodiment, for example, the memory device 520 may include: a nonvolatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano-floating gate memory ("NFGM") device, a polymer random access memory ("PoRAM") device, a magnetic random access memory ("MRAM") device, and a ferroelectric random access memory ("FRAM") device; and/or a volatile memory device such as a dynamic random access memory ("DRAM") device, a static random access memory ("SRAM") device, and a mobile DRAM device. The storage device 530 may include a solid state drive ("SSD"), a hard disk drive ("HDD"), a CD-ROM, or the like. The I/O device 540 may include: an input device such as a keyboard, a keypad, a touch pad, a touch screen, and a mouse; and an output device such as a speaker or a printer. The power supply 550 may supply a power used for the operations of the electronic device 500.

The display device 560 may be connected to other components through the buses or other communication links. In an embodiment, the display device 560 may be included in the I/O device 540. In such an embodiment, as described above, since the organic layer formed by using the first stacked structure, the second stacked structure, and the first to third dams, the display device 560 may include an organic layer with improved manufacturing quality. Accordingly, quality of the display device 560 may be improved. Herein, any repetitive detailed descriptions of the same or like elements as those described above will be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display apparatus including a display area for displaying an image and a non-display area adjacent to the display area, the method comprising:
    providing a thin film transistor layer, which includes a thin film transistor and an insulating layer, on a base substrate;
    providing a first via insulating layer on the thin film transistor layer;
    providing a conductive layer, which includes a power supply wire, on the first via insulating layer;
    providing a second via insulating layer on the first via insulating layer, on which the conductive layer is provided, wherein a portion of the second via insulating layer constitutes a first dam disposed in the non-display area to surround the display area, wherein a portion of the second via insulating layer constitutes a first stacked structure disposed between the first dam and the display area in the non-display area;
    providing a first inorganic layer on the base substrate, on which the second via insulating layer is provided;
    providing an organic material onto the first inorganic layer; and
    determining a location of an outer periphery of the organic material, which spreads along a top surface of the first inorganic layer, based on change of a light reflection degree on the first stacked structure.

2. The method of claim 1, wherein
    a portion of the second via insulating layer constitutes a second stacked structure disposed between the first stacked structure and the display area in the non-display area, and
    the location of the outer periphery of the organic material is determined to reach a predetermined level when the light reflection degree on the second stacked structure is lowered after the light reflection degree on the first stacked structure is lowered.

3. The method of claim 2, further comprising:
    providing a pixel-defining layer on the second via insulating layer and the first via insulating layer,
    wherein the first dam includes a portion of the pixel-defining layer,
    the first stacked structure includes a portion of the pixel-defining layer,
    the second stacked structure includes a portion of the pixel-defining layer, and
    a height of the first dam is greater than a height of each of the first stacked structure and the second stacked structure.

4. The method of claim 3, further comprising:
    providing a first electrode in the display area on the second via insulating layer, on which the pixel-defining layer is formed;
    providing a light-emitting layer on the first electrode; and
    providing a second electrode on the light-emitting layer,
    wherein the second electrode overlaps a substantially entire portion of the first stacked structure and at least a portion of the first dam.

5. The method of claim 1, wherein
    a plurality of holes are formed through the power supply wire, and
    the holes are located between the first stacked structure and the first dam.

\* \* \* \* \*